(12) United States Patent
Kang (10) Patent No.: US 9,818,572 B2
(45) Date of Patent: Nov. 14, 2017

(54) SUBSTRATE TREATMENT APPARATUS

(71) Applicant: JUSUNG ENGINEERING CO., LTD., Gwangju-si, Gyeonggi-do (KR)

(72) Inventor: Ho Chul Kang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 71 days.

(21) Appl. No.: 14/020,669

(22) Filed: Sep. 6, 2013

(65) Prior Publication Data

US 2014/0008021 A1 Jan. 9, 2014

Related U.S. Application Data

(62) Division of application No. 12/633,849, filed on Dec. 9, 2009, now abandoned.

(30) Foreign Application Priority Data

Dec. 10, 2008 (KR) .................. 10-2008-0125507
Sep. 30, 2009 (KR) .................. 10-2009-0093151

(51) Int. Cl.
*H01J 37/04* (2006.01)
*C23C 16/509* (2006.01)
*H01J 37/32* (2006.01)

(52) U.S. Cl.
CPC .......... *H01J 37/04* (2013.01); *C23C 16/5096* (2013.01); *H01J 37/32091* (2013.01); *H01J 37/32577* (2013.01)

(58) Field of Classification Search
CPC .......... H01J 37/32577; C23C 16/4402; C23C 16/45593; C23C 16/45525; C23C 16/52; C23C 16/4412

USPC .......... 156/345.43–345.47; 118/715, 722, 118/723 R, 723 E; 315/111.21
See application file for complete search history.

(56) References Cited

U.S. PATENT DOCUMENTS

| | | | | |
|---|---|---|---|---|
| 5,324,360 A | * | 6/1994 | Kozuka | C23C 16/5096 118/719 |
| 5,665,167 A | | 9/1997 | Deguchi et al. | |
| 2005/0173070 A1 | * | 8/2005 | Lee | H01J 37/32174 156/345.43 |
| 2006/0016559 A1 | | 1/2006 | Kobayashi et al. | |
| 2006/0027327 A1 | * | 2/2006 | Sorensen et al. | 156/345.47 |

(Continued)

FOREIGN PATENT DOCUMENTS

| | | |
|---|---|---|
| CN | 101086061 A | 12/2007 |
| JP | 10107012 B | 4/1998 |

(Continued)

*Primary Examiner* — Rudy Zervigon
(74) *Attorney, Agent, or Firm* — Renaissance IP Law Group LLP (57) ABSTRACT

A substrate treatment apparatus includes a chamber providing a reaction region and including first and second sides facing each other, a module connected to the first side, an upper electrode in the reaction region, a substrate holder facing the upper electrode, wherein a substrate is disposed on the substrate holder, and first and second points are defined on the substrate, wherein the first point corresponds to a center of the substrate, and the second point is distant from the first point toward the first side, and a feeding line for applying an RF power, the feeding line connected to the upper electrode corresponding to the second point.

18 Claims, 7 Drawing Sheets

(56) References Cited

U.S. PATENT DOCUMENTS

| | | |
|---|---|---|
| 2007/0210032 A1 | 9/2007 | Nishio |
| 2007/0235412 A1 | 10/2007 | Fischer |
| 2008/0187682 A1 | 8/2008 | Park et al. |
| 2009/0101069 A1* | 4/2009 | Anwar .............. C23C 16/45565 118/723 E |
| 2009/0159423 A1* | 6/2009 | Kudela ............. H01J 37/32091 204/157.44 |

FOREIGN PATENT DOCUMENTS

| | | |
|---|---|---|
| JP | 2003524895 | 8/2003 |
| KR | 20050009889 | 1/2005 |
| KR | 20050018066 A | 2/2005 |
| KR | 20080048243 | 6/2008 |
| KR | 20080058627 A | 6/2008 |
| TW | 200843565 A | 11/2008 |
| WO | 2007112179 A | 10/2007 |

* cited by examiner

SUBSTRATE TREATMENT APPARATUS

This application is a divisional of U.S. patent application Ser. No. 12/633,849, filed Dec. 9, 2009 which claims the benefit of Korean Patent Applications No. 10-2008-0125507 filed on Dec. 10, 2008 and No. 10-2009-0093151 filed on Sep. 30, 2009, which is hereby incorporated by references.

BACKGROUND OF THE INVENTION

1. Field of the Invention

The present invention relates to a substrate treatment apparatus, and more particularly, to a substrate treatment apparatus having uniform plasma.

2. Discussion of the Related Art

In general, a semiconductor device, a display device or a thin film solar cell is fabricated through a deposition process for depositing a thin film on a substrate, a photolithography process for exposing or covering a selected area of the thin film using a photosensitive material, and an etching process for patterning the selected area of the thin film. Among the processes, the deposition process and the etching process are performed in a substrate treatment apparatus, which is set up with optimum conditions.

Figure 1:
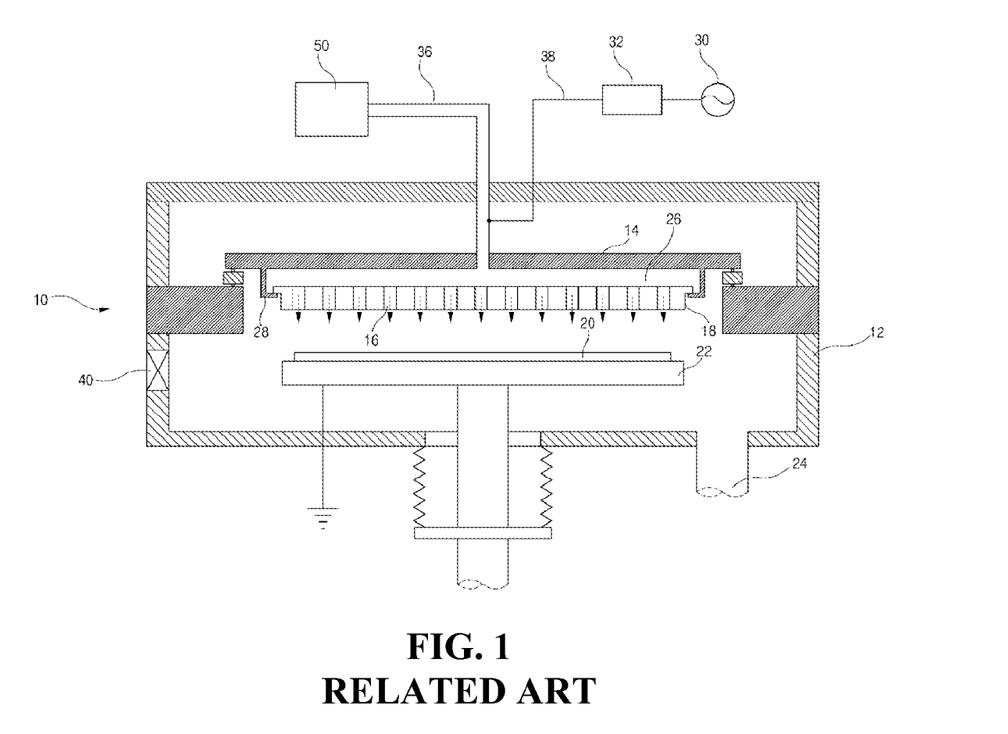
FIG. 1 is a cross-sectional view of illustrating a substrate treatment apparatus according to the related art.
Figure 2:
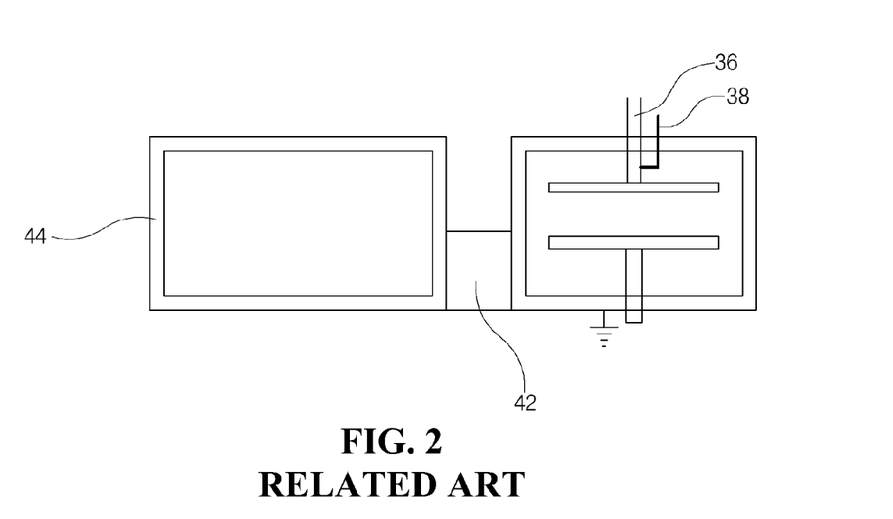
FIG. 2 is a schematic view of illustrating a substrate treatment apparatus including a transfer chamber according to the related art.

FIG. 1 is a cross-sectional view of illustrating a substrate treatment apparatus according to the related art, and FIG. 2 is a schematic view of illustrating a substrate treatment apparatus including a transfer chamber according to the related art.

In FIG. 1, a substrate treatment apparatus 10 includes a process chamber 12, a backing plate 14, a gas supply line 36, a gas distribution plate 18, a substrate holder 22, a substrate entrance 40, and an outlet 24. The process chamber 12 provides a reaction space. The backing plate 14 is located in an upper portion inside the process chamber 12 and is used as a plasma electrode. The gas supply line 36 is connected to the backing plate 14 and provides source gases into the process chamber 12. The gas distribution plate 18 is located under the backing plate 14 and is formed of aluminum. The gas distribution plate 18 includes a plurality of injection holes. The substrate holder 22 is used as a counter electrode to the plasma electrode, and a substrate 20 is disposed on the substrate holder 22. The substrate 20 is carried into or out of the process chamber 12 through the substrate entrance 40. Reaction gases used in the process chamber 12 and by-products are discharged through the outlet 24.

The gas supply line 36 is connected to a radio frequency (RF) power source 30 through a power feeding line 38. In addition, the gas supply line 36 is connected to a remote plasma controller 50. A matcher 32 for adjusting impedance is set up between the RF power source 30 and the power feeding line 38. A buffer space 26 is formed between the gas distribution plate 18 and the backing plate 14, and the gas distribution plate 18 is put on a support 28 extending from and connected to the backing plate 14. The source gases are supplied into the process chamber 12, and an RF power from the RF power source 30 is applied to the backing plate 14 and the gas distribution plate 18. Plasma is generated due to an electric field between the gas distribution plate 18 and the substrate holder 22. Therefore, a thin film is formed on the substrate 20, or a thin film on the substrate 20 is etched.

The gas distribution plate 36 is positioned at a central part of the backing plate 14 corresponding to a center of the process chamber 12. The backing plate 14 has a symmetric structure with respect to each of a vertical line and a horizontal line passing through the gas supply line 36. To process the substrate 20 in the process chamber 12, as shown in FIG. 2, a slot valve 42 is connected to the substrate entrance 40 of the process chamber 12, and a transfer chamber 44 is connected to the slot valve 42. The transfer chamber 44 supplies the substrate 20 to the process chamber 12 or carries the substrate 20 out of the process chamber 12.

The slot valve 42 and the transfer chamber 44 are sequentially connected to a first side of the process chamber 12 having the substrate entrance 40, but a slot valve and a transfer chamber are not connected to a second side of the process chamber 12 opposite to the substrate entrance 40. In addition, when the RF power is applied to the backing plate 14 and the gas distribution plate 18, RF currents provided from the RF power source 30 flow along surfaces of the process chamber 12, the slot valve 42 and the transfer chamber 44, which are formed of conductive materials. In addition to the backing plate 14 and the gas distribution plate 18, the RF currents are carried to surfaces of adjacent conductors, that is, the process chamber 12, the slot valve 42 and the transfer chamber 44.

By the way, in the related art substrate treatment apparatus 10 as shown in FIG. 1 and FIG. 2, the plasma may not be uniformly generated. Therefore, a thin film having a non-uniform thickness may be formed on the substrate 20. The non-uniform thickness of the thin film may result from asymmetry of the electric field. The RF currents at the second side of the process chamber 12 opposite to the substrate entrance 40 flow only along the surface of the process chamber 12 and have a first path. On the other hand, the RF currents at the first side of the process chamber 12 having the substrate entrance 40 flow along the surfaces of the process chamber 12, the slot valve 40 and the transfer chamber 44 and has a second path, which is longer than the first path due to the slot valve 40 and the transfer chamber 44.

Accordingly, the asymmetry of the electric field is caused by difference between the first and second paths. The asymmetry of the electric field disturbs generation of uniform plasma and affects formation of a thin film. A thickness of the thin film formed on the substrate 10 adjacent to the first side of the process chamber 12 is thicker than a thickness of the thin film formed on the substrate 10 adjacent to the second side of the process chamber 12. Therefore, the thickness of the thin film is not uniform.

To solve the problem, the uniformity of the plasma may be improved by increasing a distance between the gas distribution plate 18 and the substrate holder 22. However, in this case, a density of plasma is lowered, and a density of a thin film formed on the substrate 10 is lowered.

SUMMARY OF THE INVENTION

Accordingly, the present invention is directed to a substrate treatment apparatus that generates uniform plasma and forms a thin film having a uniform thickness by setting up a feeding line for applying an RF power to an upper electrode corresponding to a point distant from a center of a substrate.

Another object of the present invention is to provide a substrate treatment apparatus that generates uniform plasma and forms a thin film having a uniform thickness by setting up first and second feeding lines for applying an RF power to an upper electrode corresponding to a center of a substrate and a point distant from the center of a substrate, respectively.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate treatment apparatus includes a chamber providing a reaction region and including first and second sides facing each other, a module connected to the first side, an upper electrode in the reaction region, a substrate holder facing the upper electrode, wherein a substrate is disposed on the substrate holder, and first and second points are defined on the substrate, wherein the first point corresponds to a center of the substrate, and the second point is distant from the first point toward the first side, and a feeding line for applying an RF power, the feeding line connected to the upper electrode corresponding to the second point.

In another aspect, a substrate treatment apparatus includes a chamber providing a reaction region and including first and second sides facing each other, an upper electrode in the reaction region, a substrate holder facing the upper electrode, wherein a substrate is disposed on the substrate holder, and the substrate is a rectangle having a length and a width shorter than the length, wherein first and second points are defined on the substrate, the first point corresponds to a center of the substrate, and the second point is distant from the first point toward the first side by 2% to 5% of the length of the substrate, and a feeding line for applying an RF power, the feeding line connected to the upper electrode corresponding to the second point.

In another aspect, a substrate treatment apparatus includes a chamber providing a reaction region and including first and second sides facing each other, an upper electrode in the reaction region, a substrate holder facing the upper electrode, wherein a substrate is disposed on the substrate holder, and the substrate is a rectangle having a length and a width shorter than the length, wherein first and second points are defined on the substrate, the first point corresponds to a center of the substrate, and the second point is distant from the first point toward the first side by 10% to 30% of the length of the substrate, and first and second feeding lines for applying an RF power, the first and second feeding lines connected to the upper electrode corresponding to the first and second points, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred exemplary embodiments, examples of which are illustrated in the accompanying drawings. Wherever possible, similar reference numbers will be used to refer to the same or similar parts.

Figure 3:
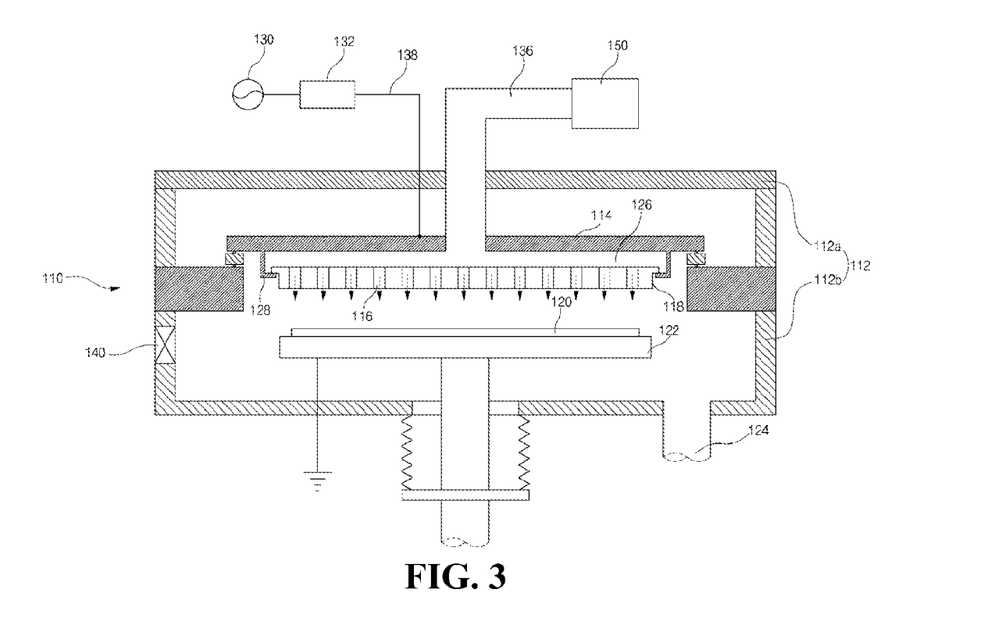
FIG. 3 is a cross-sectional view of illustrating a substrate treatment apparatus according to a first embodiment of the present invention.
Figure 4:
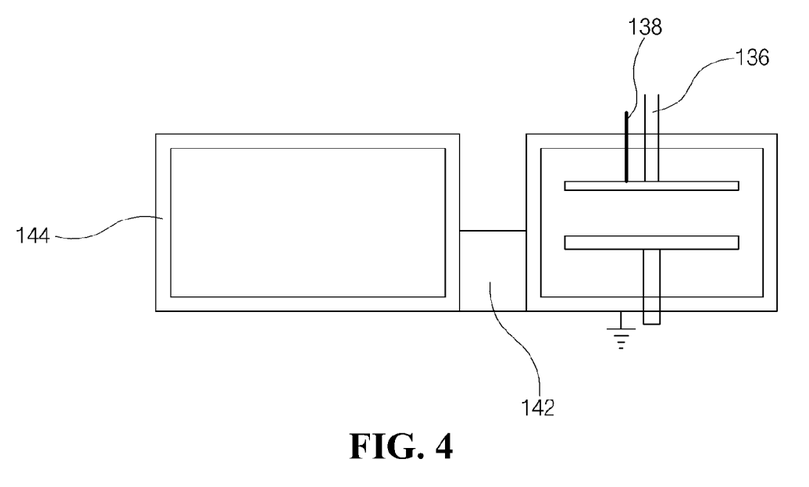
FIG. 4 is a schematic view of illustrating a substrate treatment apparatus including a transfer chamber according to the first embodiment of the present invention.
Figure 5:
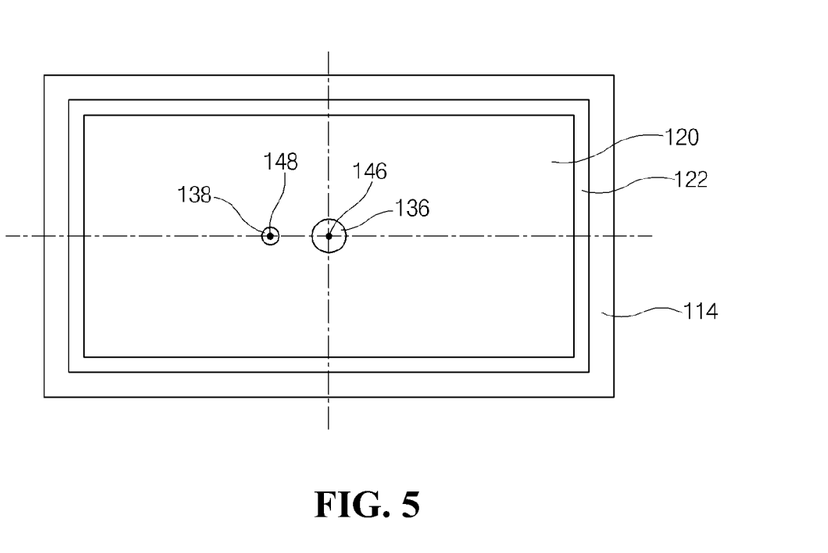
FIG. 5 is a plan view of illustrating a substrate treatment apparatus according to the first embodiment of the present invention
Figure 8:
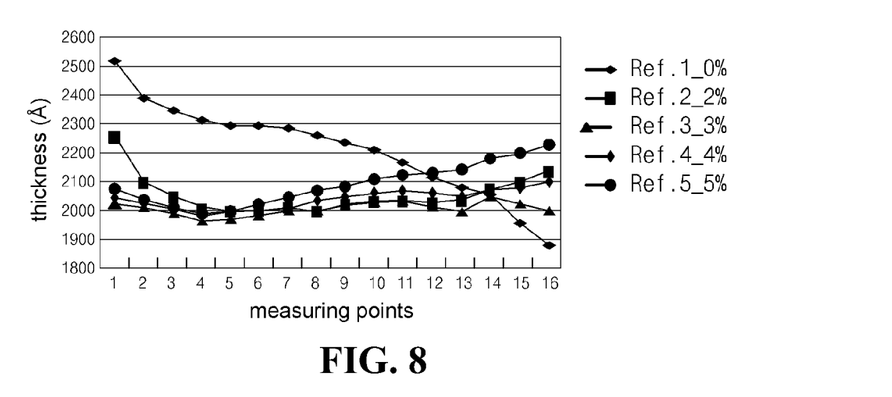
FIG. 8 is a graph showing a thickness of a thin film according a distance of a power feeding line in the first embodiment of the present invention.
Figure 9:
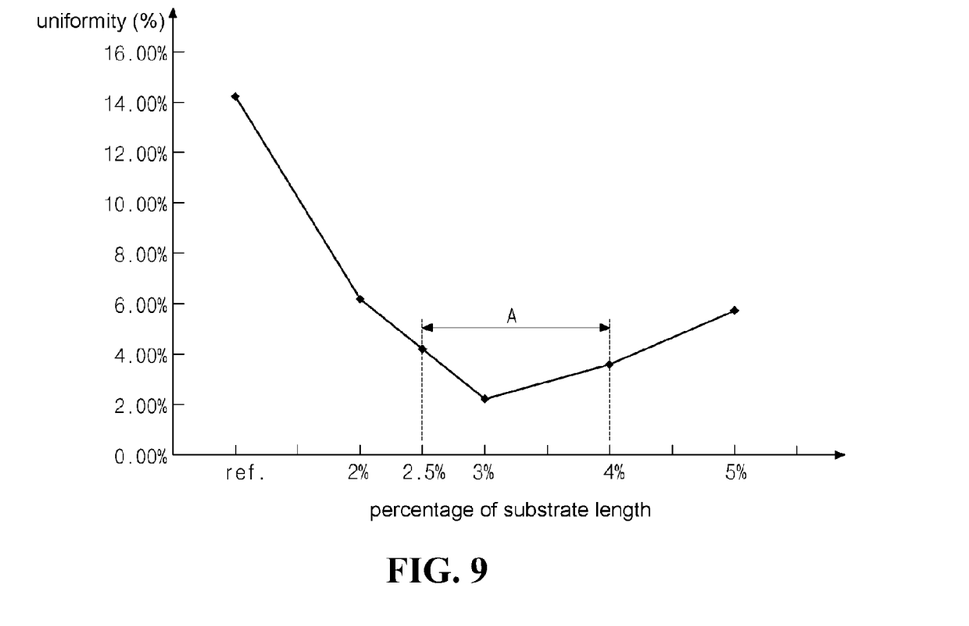
FIG. 9 is a graph showing a uniformity of a thin film according a distance of a power feeding line in the first embodiment of the present invention.

FIG. 3 is a cross-sectional view of illustrating a substrate treatment apparatus according to a first embodiment of the present invention. FIG. 4 is a schematic view of illustrating a substrate treatment apparatus including a transfer chamber according to the first embodiment of the present invention. FIG. 5 is a plan view of illustrating a substrate treatment apparatus according to the first embodiment of the present invention. FIG. 8 is a graph showing a thickness of a thin film according a distance of a power feeding line in the first embodiment of the present invention. FIG. 9 is a graph showing a uniformity of a thin film according a distance of a power feeding line in the first embodiment of the present invention.

In FIG. 3, a substrate treatment apparatus 110 for processing a substrate for a semiconductor device or a large-sized liquid crystal display device includes a process chamber 112, a backing plate 114, a gas supply line 136, a gas distribution plate 118, a substrate holder 122, a substrate entrance 140, and an outlet 124. The process chamber 112 provides a reaction space and includes a first side and a second side opposite to the first side. The backing plate 114 is located in an upper portion inside the process chamber 112 and is used as an upper electrode. The gas supply line 136 is connected to the backing plate 114 and provides source gases into the process chamber 112. The gas distribution plate 118 is located under the backing plate 114 and is formed of aluminum. The gas distribution plate 118 includes a plurality of injection holes 116. The substrate holder 122 is used as a counter electrode to the upper electrode, that is, a lower electrode, and a substrate 120 is disposed on the substrate holder 122. The substrate entrance 140 is set up at the first side of the process chamber 112 to carry the substrate 120 into or out of the process chamber 112 therethrough. Reaction gases used in the process chamber 112 and by-products are discharged through the outlet 124.

To process the substrate 120 in the process chamber 112, as shown in FIG. 4, a slot valve 142 is connected to the substrate entrance 140, and a module 144 for supplying the substrate 120 to the process chamber 112 or carrying the substrate 120 out of the process chamber 112. The module 144 may include a transfer chamber or a load lock chamber. When the module 144 is connected to the process chamber 112, the slot valve 142 and the module 144 are sequentially set up at the first side of the process chamber 112 having the substrate entrance 140. However, a slot valve and a module are not set up at the second side of the process chamber 112 opposite to the first side of the process chamber 112 having the substrate entrance 140.

The process chamber 112 includes a chamber body 112a and a chamber lid 112b, which is combined with the chamber body 112 to be removable and seals up the reaction space. The chamber body 112a may have a cylindrical shape or a polygonal shape including a quadrangle of a rectangle with an opened upper part. The chamber lid 112b may be a plate that has a shape corresponding to the chamber body 112a. Although not shown in the figure, a sealing means, for example, an O-ring or a gasket, may be interposed between the chamber lid 112a and the chamber body 112b, and the chamber lid 112a and the chamber body 112b are combined by a fixing means.

The gas supply line 136 is connected to a remote plasma controller 150. A matcher 132 for adjusting impedance is set up between an RF power source 130 and a power feeding line 138. The gas distribution plate 118 is put on a support 128 extending from and connected to the backing plate 114 such that a buffer spacer 126 is formed between the gas distribution plate 118 and the backing plate 114.

The buffer space 126 accommodates the source gases provided from the gas supply line 136, and the backing plate 114 prevents the source gases from leaking upward beyond the buffer space 126. The source gases are uniformly injected toward the substrate holder 122 through the gas distribution plate 114. Accordingly, the source gases are supplied between the substrate holder 122 and the gas distribution plate 118, and an RF power is applied to the backing plate 114 and the gas distribution plate 118. Plasma is generated due to an electric field between the gas distribution plate 118 and the substrate holder 122. Therefore, a thin film may be formed on the substrate 120, or a thin film on the substrate 120 may be etched. The substrate holder 122 may be grounded.

As shown in FIG. 5, the substrate 120 is disposed on the substrate holder 122, and the gas supply line 136 is connected to the backing plate 114 corresponding to a first point 146, which is located at a center of the substrate 120. The substrate 120 may have a symmetric structure with respect to each of a vertical line and a horizontal line passing through the first point 146 corresponding to the gas supply line 136 in the context of the figure. The gas supply line 136 may be disposed at a central part of the backing plate 114, and the backing plate 114 may have a symmetric structure with respect to each of a vertical line and a horizontal line passing through the gas supply line 136 in the context of the figure.

The power feeding line 138 connected to the RF power source 130 is connected to the backing plate 114 corresponding to a second point 148. The second point 148 is distant from the first point 146, which is located at the center of the substrate 12 and corresponds to the gas supply line 136, toward the first side of the process chamber 112 including the substrate entrance 140 by a distance of 2% to 5% of a length of the substrate 120, which is longer than a width of the substrate 120 having a rectangular shape. The power feeding line 138, beneficially, is set up to the backing plate 114 corresponding to the second point 148, which is distant from the first point 146 of the substrate 120 corresponding to the gas supply line 136 by a distance of 3% to 4% of the length of the substrate 120.

It is desirable that the power feeding line 138 is set up at the backing plate 114 corresponding to the second point 148, which is distant from the first point 146 of the substrate 120 corresponding to the gas supply line 136 by a distance of 2.5% to 4% of the length of the substrate 120, such that a thin film formed on the substrate 120 has a thickness uniformity less than 4%.

The substrate 120 is asymmetric with respect to a vertical line passing through the second point 148 corresponding to the power feeding line 138 and symmetric with respect to a horizontal line passing through the second point 148 in the context of the figure. In FIG. 3 and FIG. 5, only one power feeding line 138 may be connected to the backing plate 114 corresponding to the second point 148.

FIG. 8 and FIG. 9 are graphs showing thickness and uniformity of a thin film according to a change of a distance between the power feeding line 138, which is connected to the backing plate 114 corresponding to the second point 148 distant from the first point 146 toward the substrate entrance 140, and the gas supply line 136, which is connected to the backing plate 114 corresponding to the first point 146 located at the center of the substrate 120, respectively, in the first embodiment of the present invention.

In FIG. 8, an X axis means a long axis passing through the first point 146 of the substrate 120, and a Y axis shows a thickness (Å) of a thin film formed on the substrate 120. More particularly, the X axis of FIG. 8 shows measuring points on a line passing through the first point 146 of the substrate 120 and being parallel to a length direction of the substrate 120. The X axis of FIG. 8 may correspond to the horizontal line passing through the first point 146 in the context of FIG. 5. The measuring points are defined such that the measuring points are disposed on the horizontal line passing through the first point 146 of the substrate 120 and are spaced apart from each other with a predetermined distance therebetween. The thickness of the thin film is measured at each of the measuring points according to the distance between the gas supply line 136 and the power feeding line 138, which are set up at the backing plate 114 corresponding to the first point 146 and the second point 148 of the substrate 120, respectively.

In FIG. 9, a Y axis shows a uniformity of a thin film, more particularly, a thickness uniformity of a thin film, and an X axis shows a change of a distance of the power feeding line 138 connected to the backing plate 114 corresponding to the second point 148, which is distant from the first point 146 toward the substrate entrance 140, from the gas supply line 136 corresponding to the first point 146, which is located at the center of the substrate 120. In short, the X axis of FIG. 9 shows the distance between the first point 146 and the second point 148, which corresponds to a percentage of the length of the substrate 120.

Thin films of many kinds of materials or of materials having various functions may be formed on the substrate 120. In the first embodiment of the present invention, a silicon nitride layer, which is widely used in a liquid crystal display device, is formed, for example. Here, the silicon nitride layer may be formed by providing $SiH_4$, $NH_3$ and $N_2$ gases of 6500 standard cubic centimeter per minute (sccm), 28000 sccm and 76500 sccm, respectively, at temperatures of 290 to 295 degrees of Celsius under a pressure of 1.2 torr in the process chamber 112 and by applying an RF power of 22 kW to the power feeding line 138. In addition, the substrate 120 may have the length of 2500 mm, the width of 2200 mm, and a thickness of 0.7 mm.

The substrate 120 may be used in eighth generation equipment for a liquid crystal display device. The substrate 120 may be a rectangle having a length of 250 cm and a width of 220 cm. In the first embodiment of the present invention shown in FIGS. 3 to 5, when the substrate 120 has the length of 250 cm and the width of 220 cm, the distance between the first point 146 and the second point 148, which respectively correspond to the gas supply line 136 and the power feeding line 138, can be defined according to a percentage of the length of the substrate 120 as shown in Table 1.

TABLE 1

| | percentage of substrate length | distance between first and second points |
|---|---|---|
| Ref. 1 | 0% | 0 cm |
| Ref. 2 | 2% | 5 cm |
| Ref. 3 | 3% | 7.5 cm |
| Ref. 4 | 4% | 10 cm |
| Ref. 5 | 5% | 12.5 cm |

The measuring points, which are spaced apart from each other with a predetermined distance therebetween, are defined on the long axis passing through the first point 146 of the substrate 120. A thickness of each thin film, which is formed according to conditions of Ref. 1 to Ref. 5, is measured at each of the measuring points. A thickness uniformity of each thin film is calculated using maximum and minimum thickness values and is shown in Table 2. FIG. 9 shows the data of Table 2 as a graph.

TABLE 2

| | maximum thickness (Å) | minimum thickness (Å) | thickness uniformity (%) |
|---|---|---|---|
| Ref. 1 | 2506 | 1875 | 14.40 |
| Ref. 2 | 2246 | 1987 | 6.13 |
| Ref. 3 | 2046 | 1960 | 2.15 |
| Ref. 4 | 2091 | 1980 | 3.67 |
| Ref. 5 | 2217 | 1984 | 5.58 |

In Table 1, Ref. 1 corresponds to a case that the power feeding line 138 is connected to the gas supply line 136 and the distance between the first point 146 and the second point 148 is 0 cm. Ref. 2, Ref. 3, Ref. 4 and Ref. 5 correspond to cases that the second point 148 is distant from the first point 146 by 2%, 3%, 4% and 5% of the length of the substrate 120, respectively. In Table 2, the thickness uniformity of each thin film is calculated by the equation of "{(maximum thickness−minimum thickness)/(maximum thickness+minimum thickness)}×100."

Like Ref. 1 of Table 1, when the power feeding line 138 is connected to the gas supply line 136 and the power feeding line 138 is disposed at the backing plate 114 corresponding to the center of the substrate 120, the thickness of the thin film on the substrate 120 adjacent to the first side of the process chamber 112 having the substrate entrance 140, which is about 2,500 Å, is thicker than the thickness of the thin film on the substrate 120 adjacent to the second side of the process chamber 112 facing the substrate entrance 140, which is about 1,900 Å. Accordingly, in the case of Ref. 1 of Table 1, the thickness uniformity of the thin film formed on the substrate 120 is about 14.40% as shown in Table 2, and thickness deviation of the thin film is very high.

However, like Ref. 2 to Ref. 5 of Table 1, when the power feeding line 138 is connected to the backing plate 114 corresponding to the second point 148, which is distant from the first point 146 of the substrate 120, the thickness uniformity of the thin film formed on the substrate 120 is considerably improved as shown in Table 2.

As shown in Table 1, when the second point 148 is distant from the first point 146 by 5 cm, that is, in the case of Ref. 2, the thickness of the thin film is relatively thick on the substrate 120 adjacent to each of the first side of the process chamber 112 having the substrate entrance 140 and the second side of the process chamber 112 facing the first side and is relatively thin on the center of the substrate 120. As shown in Table 2, the thickness uniformity of the thin film is about 6.13% improved as compared with Ref. 1.

As shown in Table 1, when the second point 148 is distant from the first point 146 by 12.5 cm, that is, in the case of Ref. 5, the thickness of the thin film decreases from the first side of the process chamber 112 to the central portion of the process chamber 112 and increases from the central portion of the process chamber 112 to the second side of the process chamber 112. As shown in Table 2, the thickness uniformity of the thin film is about 5.58% improved as compared with Ref. 1.

As shown in Table 1, in cases of Ref. 3 and Ref. 4, the thickness of each thin film has some deviations on the substrate 120 adjacent to the first side and the second side of the process chamber 112, and the thickness uniformities are 2.15% and 3.67%, respectively, which are relatively uniform.

As shown in FIG. 8, in cases of Ref. 3 to Ref. 5 that the distance between the first point 146 and the second point 148, which corresponds to the power feeding line 138 and is distant from the first point 146 toward the substrate entrance 140, is within a range of 3% to 5% of the length of the substrate 120, the thickness of the thin film formed on the substrate 120 adjacent to the first side of the process chamber 112 is thinner than the thickness of the thin film formed on the substrate 120 adjacent to the second side of the process chamber 112 opposite to the first side of the process chamber 112 as compared with cases of Ref. 1 and Ref. 2.

According to the experimental results of FIG. 8, FIG. 9, Table 1 and Table 2, when the power feeding line 138 is connected to the backing plate 114 corresponding to the second point 148, which is distant from the first point 146 of the substrate 120 by about 5 cm to about 12 cm, the thickness uniformity can be improved to be less than 10%. When the thin film is formed according to the conditions of Ref. 2 to Ref. 5 of Table 1, the thickness uniformity of Table 2 is within a range of 0 to 10%.

Beneficially, when the power feeding line 138 is connected to the backing plate 114 corresponding to the second point 148, which is distant from the first point 146 by 7 cm to 10 cm, the thickness uniformity of the thin film can be further improved. The lower value the thickness uniformity of the thin film has, the better the thickness uniformity of the thin film is, and it is best that the thickness uniformity of the thin film is 0%. Generally, when the thin film is used in a display device or a semiconductor device, it is okay that the thickness uniformity of the thin film is less than 10%. However, when high accuracy is required, conditions for the thickness uniformity near 0% can be chosen.

To manufacture good products, the thin film formed on the substrate 120, desirably, has the thickness uniformity of less than 4%. Referring to FIG. 9, the distance from the power feeding line 138 to the gas supply line 136, which corresponds to the thickness uniformity of 0% to 4%, is within the "A" range of the length of the substrate 120, that is, 2.5% to 4%. Therefore, it is desirable that the power feeding line 138 is set up to the backing plate 114 corresponding to the second point 148, which is distant from the first point 146 of the substrate 120 corresponding to the gas supply line 136 by 2.5% to 4% of the length of the substrate 120, such that the thickness uniformity of the thin film formed on the substrate 120 is within a range of 0% to 4%.

It is obtained by analyzing results of experiments that the power feeding line 138 is set up at the second point 148, which is distant from the first point 146 toward the substrate entrance 140 by 2% to 5% of the length of the substrate 120. It is understood that the thickness of the thin film may vary because a center of the electric field moves according to the position of the power feeding line 138.

When the RF power from the RF power source 130 is applied to the backing plate 114 and the gas distribution plate 118, RF currents flow along the surfaces of the process chamber 112, the slot valve 142 and the module 144 that are formed of conductive materials due to the RF power. In addition to the backing plate 114 and the gas distribution plate 118, the RF currents are carried to surfaces of adjacent conductors, namely, the process chamber 112, the slot valve 142 and the module 144.

In the first embodiment of the present invention, if the power feeding line 138 is set up as shown in FIG. 3 to FIG. 5, the thickness uniformity of the thin film formed on the substrate 120 is improved. This is why the asymmetry of the electric field of the related art is improved, and a uniform thin film is formed. The RF currents, which flow along the surface of the process chamber 112 at the second side of the process chamber 112 facing the substrate entrance 140 and are grounded, have a first path, and the RF currents, which flow along the surfaces of the process chamber 112, the slot valve 140 and the module 144 at the first side of the process chamber 112 having the substrate entrance 140 and are grounded, have a second path. Since the power feeding line 138 is set up to move from the center of the process chamber 112 toward the substrate entrance 140, the asymmetry of the RF currents flowing along the first and second paths is improved, and the deviation of the thickness of the thin film on the substrate 120 is minimized.

By setting up the power feeding line 138 off from the center as stated above, there is an effect that the RF currents flowing along the first and second paths are substantially symmetric. In addition, the gas supply line 136 may be set up to the backing plate 114 where the power feeding line 138 is disposed, and the power feeding line 138 may be connected to the gas supply line 136. At this time, the gas supply line 136 may be disposed at the second point 148.

Figure 6:
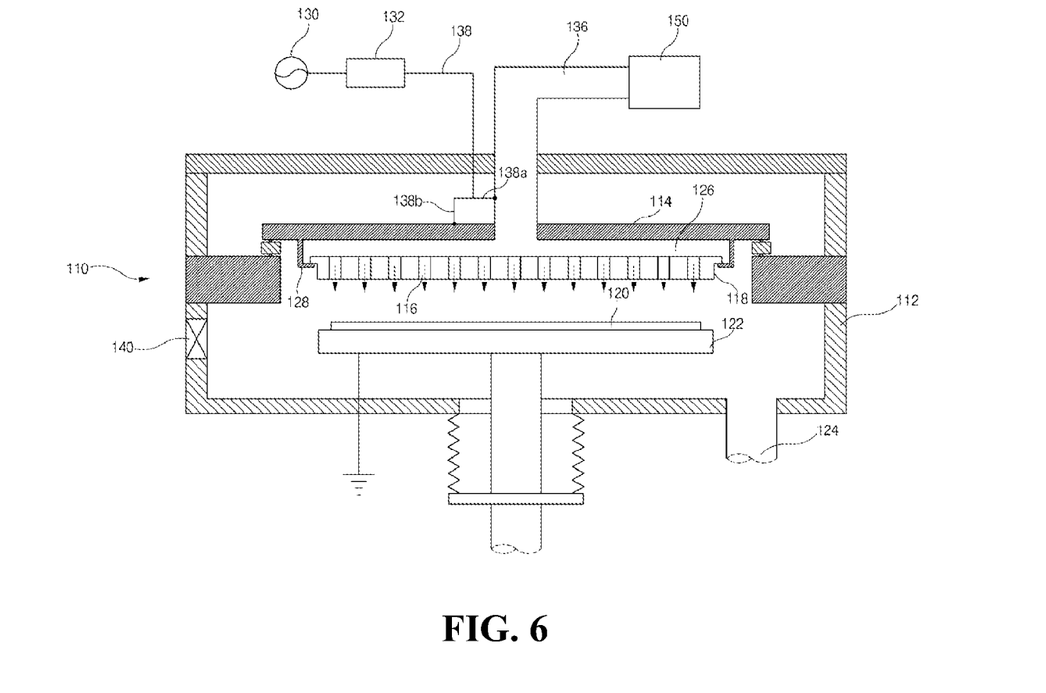
FIG. 6 is a cross-sectional view of illustrating a substrate treatment apparatus according to a second embodiment of the present invention.
Figure 7:
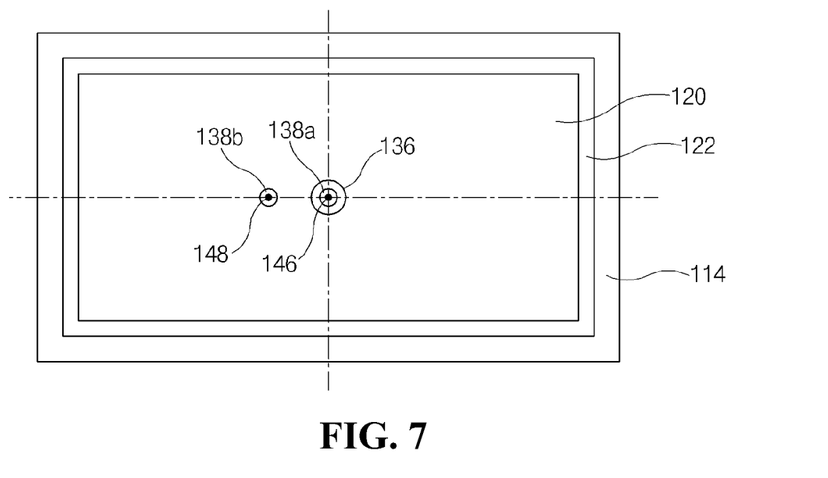
FIG. 7 is a plan view of illustrating a substrate treatment apparatus according to the second embodiment of the present invention.
Figure 10:
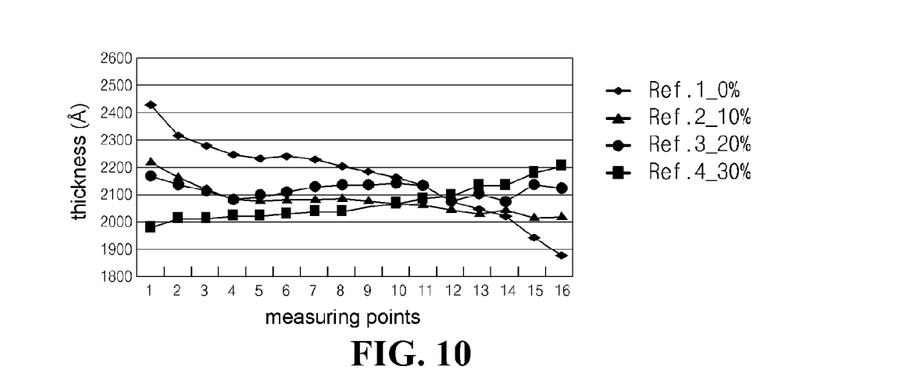
FIG. 10 is a graph showing a thickness of a thin film according a distance of a power feeding line in the first embodiment of the present invention.
Figure 11:
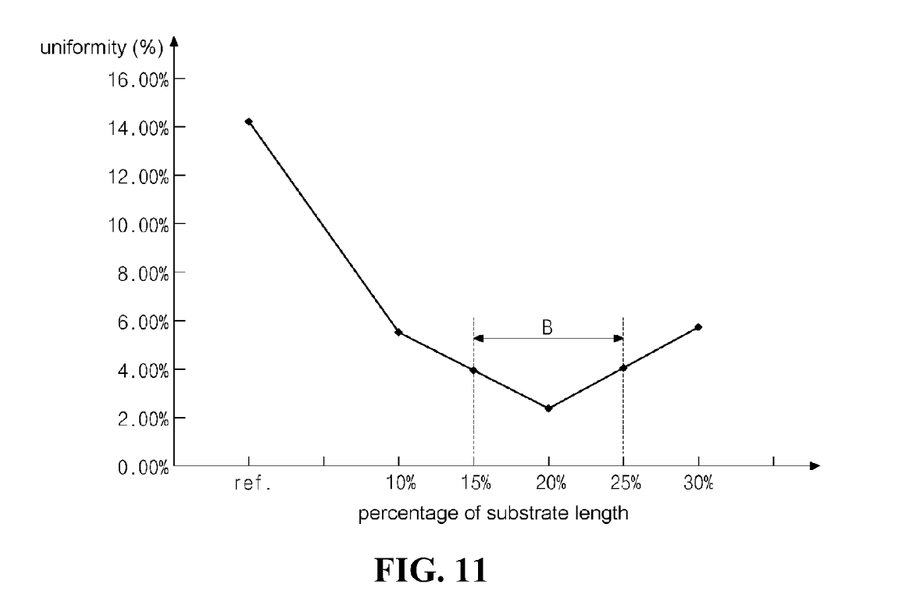
FIG. 11 is a graph showing a uniformity of a thin film according a distance of a power feeding line in the first embodiment of the present invention.

FIG. 6 is a cross-sectional view of illustrating a substrate treatment apparatus according to a second embodiment of the present invention. FIG. 7 is a plan view of illustrating a substrate treatment apparatus according to the second embodiment of the present invention. FIG. 10 is a graph showing a thickness of a thin film according a distance of a power feeding line in the first embodiment of the present invention. FIG. 11 is a graph showing a uniformity of a thin film according a distance of a power feeding line in the first embodiment of the present invention.

In FIG. 6 and FIG. 7, the substrate 120 is disposed on the substrate holder 122, and the gas supply line 136 is connected to the backing plate 114, which as indicated above acts as an upper electrode. FIG. 5 and FIG. 7, which are plan views, show the gas supply line 136 at a position corresponding to the center of the backing plate 114. The center of the backing plate 114 corresponds with the first point 146, as shown in FIG. 5 and FIG. 7. The first point 146 is also shown in FIG. 5 and FIG. 7 located at the center of the substrate 120. The substrate 120 may have a symmetric structure with respect to each of a vertical line and a horizontal line passing through the first point 146 corresponding to the gas supply line 136 in the context of the figures. The gas supply line 136 may be disposed at a central part of the backing plate 114, as shown in FIGS. 5-7, and the backing plate 114 may have a symmetric structure with respect to each of a vertical line and a horizontal line passing through the gas supply line 136 in the context of the figures and as particularly shown in FIG. 5 and FIG. 7 with the gas supply line 136 at the first point 146 at the center of the back plate 114. FIG. 7 additionally depicts the gas supply line 136 and the power feeding line 138a coaxially aligned at the first point 146.

The power feeding line 138 connected to the RF power source 130 includes first and second power feeding lines 138a and 138b. The first power feeding line 138a is connected to the gas supply line 136. The second power feeding line 138b is connected to the backing plate 114 corresponding to the second point 148, which is distant from the first point 146 of the substrate 120 corresponding to the gas supply line 136 toward the first side of the process chamber 112 including the substrate entrance 140 by 10% to 30% of the length of the substrate 120. The second power feeding line 138b, beneficially, is set up to the backing plate 114 corresponding to the second point 148, which is distant from the first point 146 of the substrate 120 corresponding to the gas supply line 136 toward the substrate entrance 140 by 20% of the length of the substrate 120.

The substrate 120 is asymmetric with respect to a vertical line passing through the second point 148 corresponding to the second power feeding line 138b and symmetric with respect to a horizontal line passing through the second point 148 in the context of the figures. More than two power feeding lines may be set up as occasion demands. At this time, one of the power feeding lines may be set up to the backing plate 114 corresponding to the first point 146 of the substrate 120, and the others of the power feeding lines may be set up to the backing plate 114 corresponding to an area between the substrate entrance 140 and the first point 146 of the substrate 120.

When the gas supply line 136 is disposed at the central part of the backing plate 114, the first power feeding line 138a may be connected to the gas supply line 136, and the second power feeding line 138b may be connected to the backing plate 114 at a point distant from the gas supply line 136 by 10% to 30% of a length of the backing plate 114, wherein the backing plate 114 is a rectangle having the length and a width, which is shorter than the length. Beneficially, the second power feeding line 138b may be set up to the backing plate 114 at a point distant from a center of the gas supply line 136 by 10% of the length of the backing plate 114.

The first point 146 and the second point 148, which respectively correspond to the first power feeding line 138a connected to the gas supply line 136 and the second power feeding line 138b, beneficially, are separated from each other by 15% to 25% of the length of the substrate 120. The backing plate 114 is asymmetric with respect to a vertical line passing through the second power feeding line 138b and symmetric with respect to a horizontal line passing through the second power feeding line 138b in the context of the figures. In FIG. 6 and FIG. 7, only two power feeding lines 138a and 138b may be connected to the backing plate 114 corresponding to the first point 146 and the second point 148, respectively.

FIG. 10 and FIG. 11 are graphs showing thickness and uniformity of a thin film according to a change of a distance between the first point 146 and the second point 148 when the first power feeding line 138a is connected to the gas supply line 136 corresponding to the first point 146, which is located at the center of the substrate 120, and the second power feeding line 138b is connected to the backing plate 114 corresponding to the second point 148 distant from the first point 146 toward the substrate entrance 140 in the second embodiment of the present invention.

In FIG. 10, an X axis means a long axis passing through the first point 146 of the substrate 120, and a Y axis shows a thickness (Å) of a thin film formed on the substrate 120. More particularly, the X axis of FIG. 8 shows measuring points on a line passing through the first point 146 of the substrate 120 and being parallel to a length direction of the substrate 120. The X axis of FIG. 8 may correspond to the horizontal line passing through the first point 146 in the context of FIG. 7. The measuring points are defined such that the measuring points are disposed on the horizontal line passing through the first point 146 of the substrate 120 and are spaced apart from each other with a predetermined distance therebetween. The thickness of the thin film is measured at each of the measuring points according to the distance between the first point 146 and the second point 148, which corresponding to the first power feeding line 138a and the second power feeding line 138b, respectively.

In FIG. 11, a Y axis shows a uniformity of a thin film, more particularly, a thickness uniformity of a thin film, and an X axis shows a change of a distance between the first power feeding line 138a and the second power feeding line 138b, which respectively are connected to the gas supply line 136 corresponding to the first point 146 located at the center of the substrate 120 and the backing plate 114 corresponding to the second point 148 distant from the first point 146 toward the substrate entrance 140. The X axis of FIG. 11 corresponds to a percentage of the length of the substrate 120.

Thin films of many kinds of materials or of materials having various functions may be formed on the substrate 120. In the second embodiment of the present invention, a silicon nitride layer, which is widely used in a liquid crystal display device, is formed, for example. Here, the silicon nitride layer may be formed by providing $SiH_4$, $NH_3$ and $N_2$ gases of 6500 sccm, 28000 sccm and 76500 sccm, respectively, at temperatures of 290 to 295 degrees of Celsius under a pressure of 1.2 torr in the process chamber 112 and by applying an RF power of 22 kW to the power feeding line 138. In addition, the substrate 120 may be a glass substrate having the length of 2500 mm, the width of 2200 mm, and a thickness of 0.7 mm.

The substrate 120 may be used in eighth generation equipment for a liquid crystal display device. The substrate 120 may be a rectangle having a length of 250 cm and a width of 220 cm. In the second embodiment of the present invention shown in FIGS. 6 and 7, when the substrate 120 has the length of 250 cm and the width of 220 cm, the distance between the first point 146 and the second point 148, which respectively correspond to the first power feeding line 138a connected to the gas supply line 136 and the second power feeding line 138b, can be defined according to a percentage of the length of the substrate 120 as shown in Table 3.

TABLE 3

|  | percentage of substrate length | distance between first and second points |
|---|---|---|
| Ref. 1 | 0% | 0 cm |
| Ref. 2 | 10% | 35 cm |
| Ref. 3 | 20% | 50 cm |
| Ref. 4 | 30% | 75 cm |

The measuring points, which are spaced apart from each other with a predetermined distance therebetween, are defined on the long axis passing through the first point 146 and the second point 148 of the substrate 120. A thickness of each thin film, which is formed according to conditions of Ref. 1 to Ref. 4 of Table 3, is measured at each of the measuring points. A thickness uniformity of each thin film is calculated using maximum and minimum thickness values and is shown in Table 4. FIG. 11 shows the data of Table 4 as a graph.

TABLE 4

|  | maximum thickness (Å) | minimum thickness (Å) | thickness uniformity (%) |
|---|---|---|---|
| Ref. 1 | 2506 | 1875 | 14.40 |
| Ref. 2 | 2273 | 2038 | 5.46 |
| Ref. 3 | 2209 | 2107 | 2.36 |
| Ref. 4 | 2250 | 2001 | 5.87 |

In Table 3, Ref. 1 corresponds to a case that the first and second power feeding lines 138a and 138b are connected to the gas supply line 136 and the distance between the first point 146 and the second point 148 is 0 cm. Ref. 2, Ref. 3 and Ref. 4 correspond to cases that the second point 148 is distant from the first point 146 by 10%, 20% and 30% of the length of the substrate 120, respectively. In Table 4, the thickness uniformity of each thin film is calculated by the equation of "{(maximum thickness−minimum thickness)/(maximum thickness+minimum thickness)}×100."

Like Ref. 1 of Table 3, when the first and second power feeding lines 138a and 138b are connected to the gas supply line 136 and the second power feeding line 138b is disposed at the center of the substrate 120, the thickness of the thin film on the substrate 120 adjacent to the first side of the process chamber 112 having the substrate entrance 140, which is about 2,500 Å, is thicker than the thickness of the thin film on the substrate 120 adjacent to the second side of the process chamber 112 opposite to the first side, which is about 1,900 Å. Accordingly, in the case of Ref. 1 of Table 3, the thickness uniformity of the thin film formed on the substrate 120 is about 14.40% as shown in Table 2, and thickness deviation of the thin film is very high.

However, like Ref. 2 to Ref. 4 of Table 3, when the first power feeding line 138a is connected to the gas supply line 136 corresponding to the first point 146, which is disposed at the center of the substrate 120, and the second power feeding line 138b is connected to the backing plate 114 corresponding to the second point 148, which is distant from the first point 146 of the substrate 120, the thickness uniformity of the thin film formed on the substrate 120 is considerably improved as shown in Table 4.

In the case of Ref. 2 of Table 3 that the second point 148 is distant from the first point 146 by 25 cm, the thickness of the thin film adjacent to the first side of the process chamber 112 having the substrate entrance 140 is thicker than the thickness of the thin film adjacent to the second side of the process chamber 112 facing the first side of the process chamber 112. The thickness uniformity of the thin film is about 5.46% improved as compared with Ref. 1 of Table 3.

In the case of Ref. 3 of Table 3 that the second point 148 is distant from the first point 146 by 50 cm, the thickness of the thin film adjacent to the first side of the process chamber 112 having the substrate entrance 140 is thicker than the thickness of the thin film adjacent to the second side of the process chamber 112 facing the first side of the process chamber 112. The thickness uniformity of the thin film is about 2.36% improved as compared with Ref. 1 and Ref. 2.

In the case of Ref. 4, the thickness of the thin film increases from the first side to the second side of the process chamber 112, and the thickness uniformity of the thin film is about 5.87% improved as compared with Ref. 1.

According to the experimental results of FIG. 10, FIG. 11, Table 3 and Table 4, when the distance between the first and second power feeding lines 138a and 138b corresponding to the first and second points 146 and 148, respectively, is within a range of 25 cm to 75 cm, the thickness uniformity can be improved to be less than 10%. When the thin film is formed according to the conditions of Ref. 2 to Ref. 4 of Table 3, the thickness uniformity of Table 4 is within a range of 0 to 10%. The thickness uniformity of the thin film can be further improved when the second power feeding line 138b, beneficially, is connected to the backing plate 114 corresponding to the second point 148, which is distant from the first power feeding line 138a corresponding to the first point 146 by about 50 cm.

In the second embodiment of the present invention of FIG. 6 and FIG. 7, when the backing plate 114 has a length of 250 cm and a width of 220 cm, the second power feeding line 138 may be set up at a point distant from the center by about 25 cm to 75 cm, and desirably, may be set up at a point distant from the center by about 50 cm. Substantially, the effect is the same as when the RF power is applied to a middle point between the first and second power feeding lines 138a and 138b.

The lower value the thickness uniformity of the thin film has, the better the thickness uniformity of the thin film is, and it is best that the thickness uniformity of the thin film is 0%. Generally, when the thin film is used in a display device or a semiconductor device, it is okay that the thickness uniformity of the thin film is less than 10%. However, when high accuracy is required, conditions for the thickness uniformity near 0% can be chosen.

To manufacture good products, the thin film formed on the substrate 120, desirably, has the thickness uniformity of less than 4%. Referring to FIG. 11, the distance between the first and second power feeding lines 138a and 138b, which corresponds to the thickness uniformity of 0% to 4%, is within the "B" range of the length of the substrate 120, that is, 15% to 25%. Therefore, it is desirable that the first point 146 and the second point 148 of the substrate 120, which correspond to the first power feeding line 138a connected to the gas supply line 136 and the second power feeding line 138b, respectively, are spaced apart from each other by 15% to 25% of the length of the substrate 120, such that the thickness uniformity of the thin film formed on the substrate 120 is within a range of 0% to 4%.

It is obtained by analyzing results of experiments that the second power feeding line 138b is set up at the second point 148, which is distant from the first point 146 toward the substrate entrance 140 by 10% to 30% of the length of the substrate 120. It is understood that the thickness of the thin film may vary because a center of the electric field moves according to the position of the second power feeding line 138b.

When the RF power from the RF power source 130 is applied to the backing plate 114 and the gas distribution plate 118, RF currents flow along the surfaces of the process chamber 112, the slot valve (not shown) and the module (not shown) that are formed of conductive materials due to the RF power. In addition to the backing plate 114 and the gas distribution plate 118, the RF currents are carried to the surfaces of adjacent conductors, namely, the process chamber 112, the slot valve and the module.

If the first and second power feeding lines 138a and 138b are set up as shown in FIG. 6 and FIG. 7, the thickness uniformity of the thin film formed on the substrate 120 is improved. This is why the asymmetry of the electric field of the related art is improved, and a uniform thin film is formed. The RF currents, which flow along the surface of the process chamber 112 at the second side of the process chamber 112 facing the substrate entrance 140 from the first and second power feeding lines 138a and 138b and are grounded, have a first path, and the RF currents, which flow along the surfaces of the process chamber 112, the slot valve and the module at the first side of the process chamber 112 having the substrate entrance 140 from the first and second power feeding lines 138a and 138b and are grounded, have a second path. Since the power feeding line 138 is set up to move from the center of the process chamber 112, which corresponds to the first point 146 of the substrate 120, toward the substrate entrance 140, the asymmetry of the RF currents flowing along the first and second paths is improved, and the deviation of the thickness of the thin film on the substrate 120 is minimized.

In the substrate treatment apparatus of the present invention, since the power feeding line is connected to the upper electrode, which corresponds to the point distant from the center of the substrate toward the substrate entrance where the module such as the transfer chamber and the slot valve is set up, the asymmetry between the path of the RF currents flowing along the surface of the chamber at the side opposite to the substrate entrance and the path of the RF currents flowing at the side of the substrate entrance is improved. A thin film having a uniform thickness can be formed due to generation of uniform plasma.

Meanwhile, the power feeding line may include the first and second power feeding lines for supplying the RF power. The first power feeding line is connected to the upper electrode corresponding to the center of the substrate, and the second power feeding line is connected to the upper electrode corresponding to the point, which is distant from the center of the substrate toward the substrate entrance where the module such as the transfer chamber and the slot valve is set up. Accordingly, the asymmetry between the path of the RF currents flowing along the surface of the chamber at the side opposite to the substrate entrance and the path of the RF currents flowing at the side of the substrate entrance is improved. Therefore, a thin film having a uniform thickness can be formed due to generation of uniform plasma.

It will be apparent to those skilled in the art that various modifications and variations can be made in the apparatus without departing from the spirit or scope of the invention. Thus, it is intended that the present invention covers the modifications and variations of this invention provided they come within the scope of the appended claims and their equivalents.

What is claimed is:

1. A substrate treatment apparatus, comprising:
a chamber comprising a first side and a second side arranged on opposite sides of the chamber, said chamber providing a reaction region;
an upper electrode arranged in the reaction region,
wherein the upper electrode has a length between a first end extending toward the first side of the chamber and a second end extending toward the second side of the chamber,
wherein the upper electrode has a center between the first end and the second end;
a substrate holder facing the upper electrode and configured to receive a substrate thereon;
a gas supply line connected to the upper electrode at a position corresponding to the center of the upper electrode;
a common feeding line that receives RF power and includes first and second feeding lines for applying the RF power to the upper electrode,
wherein the first feeding line is connected to the gas supply line at a first point corresponding with the center of the upper electrode,
wherein the second feeding line is connected to the upper electrode at a second point that is offset from the first point by a distance of about 10% to about 30% of the length of the upper electrode, and
wherein the upper electrode receives RF power from the first feeding line at the first point and from the second feeding line at the second point.

2. The apparatus according to claim 1, wherein the distance between the first point and the second point is within a range of 10% to 30% of the length of the upper electrode.

3. The apparatus according to claim 1, wherein the distance between the first point and the second point is within a range of about 15% to about 25% of the length of the upper electrode.

4. The apparatus according to claim 1, wherein the distance between the first point and the second point is within a range of 15% to 25% of the length of the upper electrode.

5. The apparatus according to claim 1, wherein the distance between the first point and the second point is about 20% of the length of the upper electrode.

6. A substrate treatment apparatus, comprising:
a chamber configured to provide a reaction region and including first and second sides arranged on opposite sides of the chamber;
a substrate entrance for carrying a substrate into and out of the chamber set up at the first side;
an upper electrode arranged in the reaction region,
wherein the upper electrode has a length between a first end extending toward the first side of the chamber and a second end extending toward the second side of the chamber,
wherein the upper electrode has a center between the first end and the second end;
a gas supply line connected to the upper electrode at a position corresponding to the center of the upper electrode;
a substrate holder facing the upper electrode and configured to receive a substrate thereon, and
a common feeding line that receives RF power and includes first and second feeding lines for applying the RF power to the reaction region,
wherein the first feeding line is connected to the gas supply line at a first point corresponding with the center of the upper electrode,
wherein the second feeding line is connected to the upper electrode at a second point that is offset from the first point by a distance within a range of 25 cm to 75 cm, and
wherein the upper electrode receives RF power from the first feeding line at the first point and from the second feeding line at the second point.

7. The apparatus according to claim 6, wherein the distance between the first point and the second point is within a range of about 10% to about 30% of the length of the upper electrode.

8. The apparatus according to claim 6, wherein the distance between the first point and the second point is within a range of about 15% to about 25% of the length of the upper electrode.

9. The apparatus according to claim 6, wherein the distance between the first point and the second point is about 20% of the length of the upper electrode.

10. A substrate treatment apparatus, comprising:
a chamber having oppositely arranged first and second sides, said chamber configured to provide a reaction region for treating a substrate;
an upper electrode arranged in the reaction region,
wherein the upper electrode has a length between a first end extending toward the first side of the chamber and a second end extending toward the second side of the chamber,
wherein the upper electrode has a center between the first end and the second end;
a gas supply line connected to the upper electrode at a position corresponding to the center of the upper electrode;
a substrate holder facing the upper electrode and configured to receive a substrate thereon; and
a common feeding line that receives RF power and includes first and second feeding lines for applying the RF power to the upper electrode in the reaction region,
wherein the first feeding line is connected to the gas supply line at a first point corresponding with the center of the upper electrode,
wherein the second feeding line is connected to the upper electrode at a second point that is offset from the first point by a distance of 10% to 30% of the length of the upper electrode,
wherein the second feeding line is connected to the upper electrode at a second point that is offset from the first point by a distance within a range of 25 cm to 75 cm, and
wherein the upper electrode receives RF power from the first feeding line at the first point and from the second feeding line at the second point.

11. The substrate treatment apparatus of claim 10, wherein the distance between the first point and the second point is within a range of 15% to 25% of the length of the upper electrode.

12. The substrate treatment apparatus of claim 10, wherein the distance between the first point and the second point is 20% of the length of the upper electrode.

13. The substrate treatment apparatus of claim 1, further comprising a module connected to the first side for supplying the substrate to the chamber; wherein a substrate entrance for carrying the substrate into and out of the chamber is set up at the first side, and wherein a slot valve is set up between the module and the substrate entrance.

14. The substrate treatment apparatus of claim 6, further comprising a module connected to the first side for supplying the substrate to the chamber; wherein a slot valve is set up between the module and the substrate entrance.

15. The substrate treatment apparatus of claim 10, further comprising a module connected to the first side for supplying the substrate to the chamber; wherein a substrate entrance for carrying the substrate into and out of the chamber is set up at the first side, and wherein a slot valve is set up between the module and the substrate entrance.

16. The substrate treatment apparatus of claim 1, wherein a substrate entrance for carrying the substrate into and out of the chamber is at the first side, and wherein the second point is located closer to the first side than the second side.

17. The substrate treatment apparatus of claim 6, wherein a substrate entrance for carrying the substrate into and out of the chamber is at the first side, and wherein the second point is located closer to the first side than the second side.

18. The substrate treatment apparatus of claim 10, wherein a substrate entrance for carrying the substrate into and out of the chamber is at the first side, and wherein the second point is located closer to the first side than the second side.

* * * * *